(12) United States Patent
Yamanaka

(10) Patent No.: US 10,242,724 B2
(45) Date of Patent: *Mar. 26, 2019

(54) APPARATUSES AND METHODS FOR VOLTAGE LEVEL CONTROL

(71) Applicant: Micron Technology, Inc., Boise, ID (US)

(72) Inventor: Satoshi Yamanaka, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/485,696

(22) Filed: Apr. 12, 2017

(65) Prior Publication Data

US 2017/0237435 A1 Aug. 17, 2017

Related U.S. Application Data

(63) Continuation of application No. 15/043,086, filed on Feb. 12, 2016, now Pat. No. 9,653,131.

(51) Int. Cl.

| | |
|---|---|
| *G11C 8/08* | (2006.01) |
| *H03K 19/0185* | (2006.01) |
| *G11C 8/18* | (2006.01) |
| *G11C 5/14* | (2006.01) |
| *G11C 11/4076* | (2006.01) |
| *G11C 11/406* | (2006.01) |
| *G11C 11/408* | (2006.01) |
| *G11C 8/10* | (2006.01) |
| *H03K 19/0175* | (2006.01) |

(Continued)

(52) U.S. Cl.
CPC ............ *G11C 8/08* (2013.01); *G11C 5/145* (2013.01); *G11C 5/147* (2013.01); *G11C 8/10* (2013.01); *G11C 8/14* (2013.01); *G11C 8/18* (2013.01); *G11C 11/406* (2013.01); *G11C 11/4074* (2013.01); *G11C 11/4076* (2013.01); *G11C 11/4085* (2013.01); *G11C 11/4087* (2013.01); *H03K 19/017509* (2013.01); *H03K 19/018557* (2013.01)

(58) Field of Classification Search
CPC .. G11C 5/145; G11C 8/08; G11C 8/18; G11C 11/406; G11C 11/4076
See application file for complete search history.

(56) References Cited

U.S. PATENT DOCUMENTS

| | | | |
|---|---|---|---|
| 4,740,713 | A | 4/1988 | Sakurai et al. |
| 5,687,123 | A | 11/1997 | Hidaka et al. |

(Continued)

*Primary Examiner* — Vanthu T Nguyen
(74) *Attorney, Agent, or Firm* — Dorsey & Whitney LLP

(57) ABSTRACT

Apparatuses for voltage level control in a semiconductor device are described. An example apparatus includes: a plurality of circuits coupled in parallel between first and second nodes, the first node being supplied with a first voltage; and a voltage supply circuit that supplies the second node with one of second and third voltages, the first voltage being greater than the second voltage, and the second voltage being greater than the third voltage. The plurality of circuits includes a first circuit including a transistor coupled to the second node. The first circuit activates the transistor responsive to a first control signal and further sets a voltage level of the second node higher than the second voltage after the voltage supply circuit supplies the second nodes with the second voltage.

14 Claims, 8 Drawing Sheets

(51) Int. Cl.
*G11C 8/14* (2006.01)
*G11C 11/4074* (2006.01)

(56) References Cited

U.S. PATENT DOCUMENTS

| | | | |
|---|---|---|---|
| 5,943,273 A * | 8/1999 | Hidaka | G11C 5/14 |
| | | | 365/189.09 |
| 5,970,018 A * | 10/1999 | Iwata | G11C 8/10 |
| | | | 326/105 |
| 6,191,999 B1 | 2/2001 | Fujieda et al. | |
| 6,765,842 B2 * | 7/2004 | Kim | G11C 8/12 |
| | | | 365/203 |
| 7,436,205 B2 | 10/2008 | Tada | |
| 7,486,113 B2 * | 2/2009 | Masuo | G11C 8/08 |
| | | | 326/105 |
| 7,705,625 B2 | 4/2010 | Yoo et al. | |
| 7,855,932 B2 | 12/2010 | Chou et al. | |
| 8,044,709 B2 | 10/2011 | Sasaki et al. | |
| 8,233,347 B2 | 7/2012 | Nakamura et al. | |
| 8,553,479 B2 * | 10/2013 | Lee | G11C 8/08 |
| | | | 365/194 |
| 9,653,131 B1 | 5/2017 | Yamanaka et al. | |
| 2014/0036612 A1 | 2/2014 | Rai | |

* cited by examiner

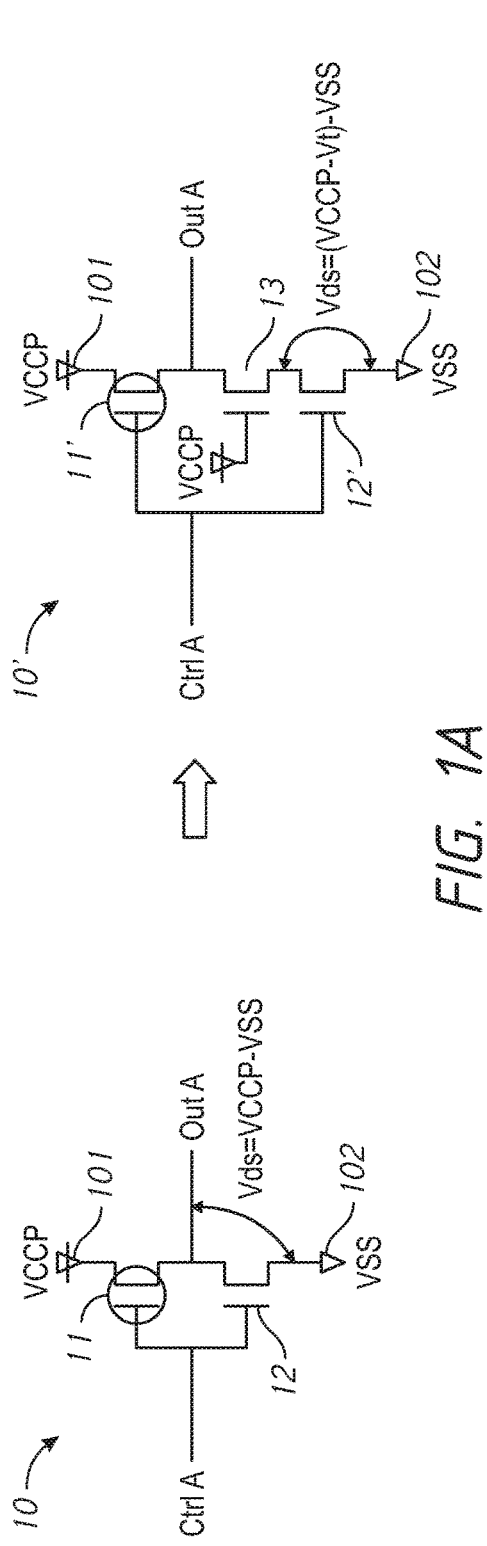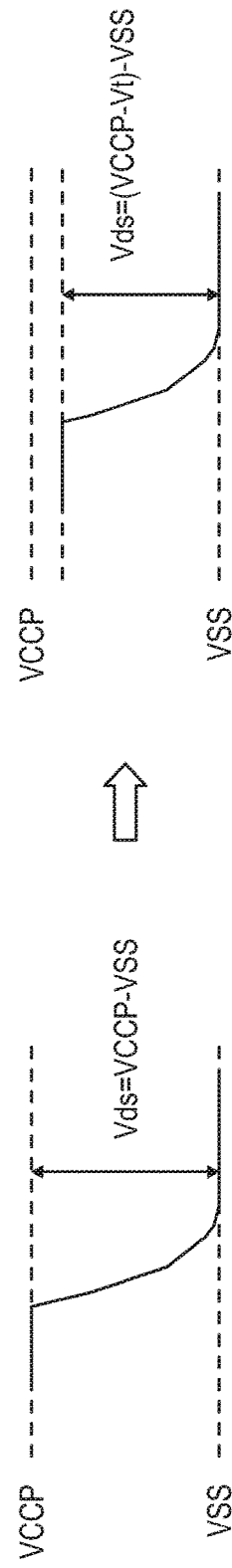
FIG. 1A (Prior Art)
FIG. 1B (Prior Art)

APPARATUSES AND METHODS FOR VOLTAGE LEVEL CONTROL

CROSS-REFERENCE TO RELATED APPLICATION(S)

This application is a continuation of U.S. application Ser. No. 15/043,086 filed Feb. 12, 2016, and issued as U.S. Pat. No. 9,653,131 on May 16, 2017 which is incorporated herein by reference, in its entirety, for any purpose.

BACKGROUND

High data reliability, high speed memory access, and reduced chip size are features that are demanded from semiconductor memory. In recent years, deterioration due to hot carrier injection has become a critical issue in the improvement of high data reliability. The term "hot carrier" refers to an electron or a hole in the substrate of a metal-oxide-semiconductor (MOS) device that has sufficient kinetic energy to free itself from an interface state. When hot carriers are produced as a result of very high fields in a drain region of a MOS field-effect transistor, the hot carriers may compromise operations of the MOS device by generating charged defects in an oxide layer, and by degrading an oxide and Si—$SiO_2$ interface. These effects may create a reliability problem. The hot carriers may also generate unwanted current components.

As preventive measures against hot carrier injection, high threshold voltage (Vt) transistors may be used in order to provide an extra voltage gap around a target transistor likely to have hot carrier injection between a positive power supply node and a ground/negative voltage node. For example, U.S. Pat. No. 4,740,713 describes a system having a longitudinally stacked configuration of transistors, including a transistor having a high Vt in order to reduce a drain-source voltage (Vds) between a drain node and a source node of the target transistor that may cause the hot carrier injection. FIG. 1A are circuit diagrams of examples of inverter circuits with and without the transistor having the high Vt. FIG. 1B includes graphs showing drain-source voltages of target transistors in the inverter circuits of FIG. 1A. For example, a first inverter circuit 10 includes a power-supply terminal 101 providing a first voltage VCCP, a ground terminal 102 providing a second voltage VSS, a first transistor 11 having a source node coupled to the power-supply terminal 101 and a second transistor 12 that is the target transistor having a source node coupled to the ground terminal 102. In the first inverter circuit 10, Vds of the second transistor 12, that is "VCCP–VSS" as shown in a left graph of FIG. 1B, may be significantly greater than the average and may cause the hot carrier injection in the second transistor 12. In another example, a second inverter circuit 10' includes a power-supply terminal 101, a ground terminal 102, a first transistor 11' having a source node coupled to the power-supply terminal 101, a second transistor 12' that is a target transistor having a source node coupled to the ground terminal 102 and a third transistor 13 having the high Vt and coupled between the first transistor 11' and the second transistor 12'. In the second inverter circuit 10', Vds of the second transistor 12' becomes "(VCCP-Vt)-VSS" as shown in a right graph of FIG. 1B. Thus, the Vds may be lower compared to not including the third transistor 13, and may prevent hot carrier injection. The above countermeasure inverter circuit 10' in FIG. 1A, however, increases a chip size. Consequently, another countermeasure circuit for the deterioration due to the hot carrier injection without requiring a significantly larger area may be desired.

BRIEF DESCRIPTION OF THE DRAWINGS

FIG. 1A are circuit diagrams of inverter circuits in a semiconductor device.

FIG. 1B are graphs showing drain-source voltages of target transistors in the inverter circuits of FIG. 1A.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 2:
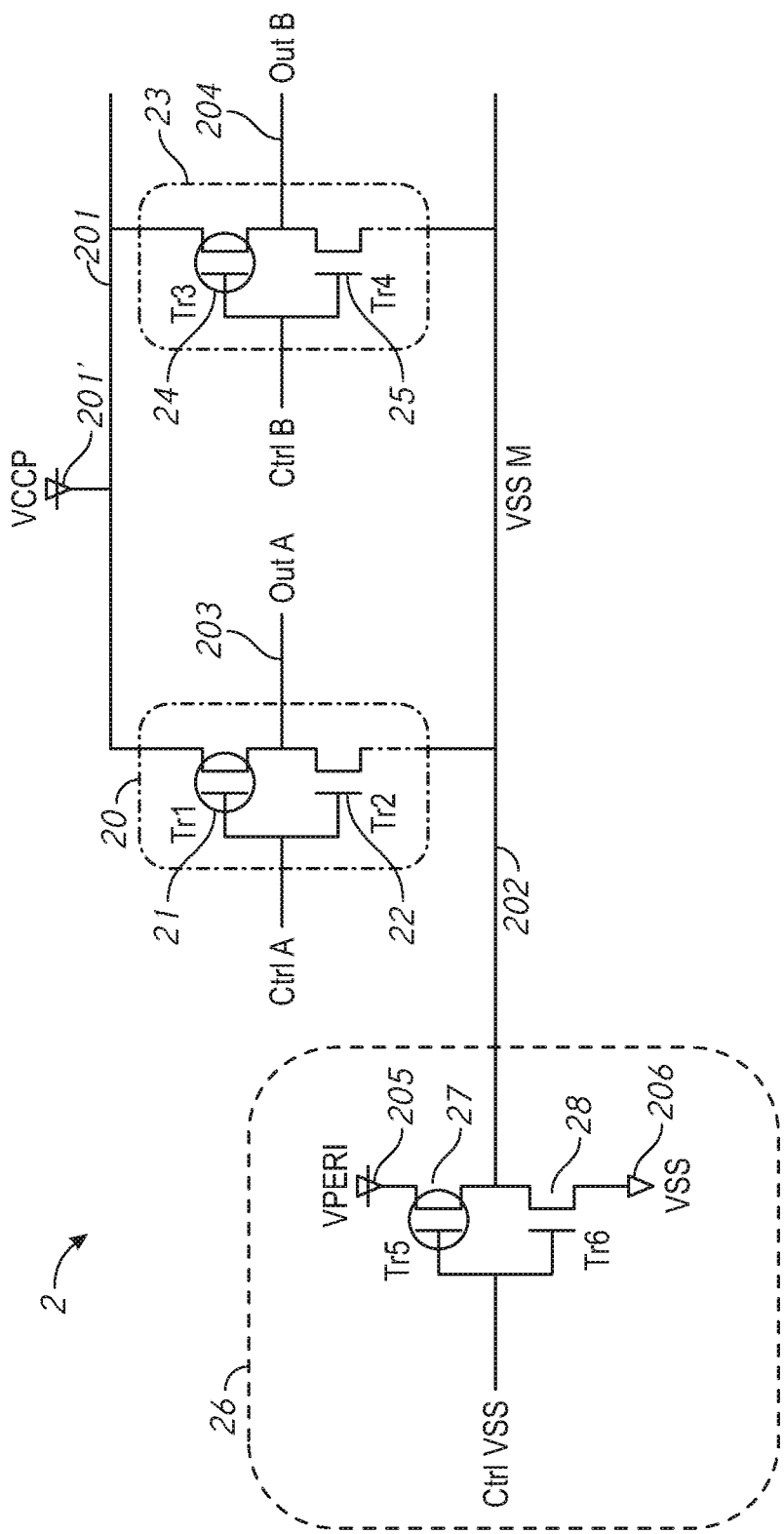
FIG. 2 is a circuit diagram of an apparatus in a semiconductor device, in accordance with an embodiment of the present disclosure.

FIG. 2 is a circuit diagram of an apparatus 2 in a semiconductor device, in accordance with an embodiment of the present disclosure. The apparatus 2 may include a plurality of circuits, such as a first circuit 20 and a second circuit 23 coupled in parallel between a first node 201 and a second node 202. The first node 201 is coupled to a first power supply terminal 201', which may be supplied with a first voltage (VCCP). The first circuit 20 includes a transistor 21 having a source node coupled to the first node 201 and a transistor 22 having a source node coupled to the second node 202. A gate of the transistor 21 and a gate of the transistor 22 are coupled to each other and receive a first control signal (Ctrl A). A drain node of the transistor 21 and a drain node of the transistor 22 are coupled to each other at a third node 203. A first output signal (Out A) is provided on the third node 203. Similarly, the second circuit 23 includes a transistor 24 and a transistor 25. The second circuit 23 receives a second control signal (Ctrl B) and provides a second output signal (Out B) on a fourth node 204.

The apparatus 2 may further include a voltage supply circuit 26. The voltage supply circuit 26 includes a transistor 27 having a source node coupled to a second power terminal 205, being supplied with a second voltage (VPERI), and a transistor 28 having a source node coupled to a ground terminal 206, being supplied with a third voltage (VSS). A gate of the transistor 27 and a gate of the transistor 28 are coupled to each other and receive a voltage supply control signal such as a VSS control signal (Ctrl VSS). A drain node of the transistor 27 and a drain node of the transistor 28 are coupled to each other at the second node 202. The second node 202 provides an intermediate signal (VSS M) on the second node 202. The first voltage (VCCP) on the first power supply terminal 201' in this example may be approximately 3V, and is greater than the second voltage (VPERI) which may be approximately 1V in this example. The second voltage (VPERI) is greater than the third voltage (VSS) which may be approximately 0V. Responsive to the VSS control signal (Ctrl VSS), the voltage supply circuit 26 provides a selected one of the second voltage and the third voltage, and provides the selected voltage to the second node 202 as the intermediate signal (VSS M).

The voltage supply circuit 26 may control a voltage level of the intermediate signal (VSS M) on the second node 202 to reduce drain-source voltage levels of the transistors in the first circuit 20 and the second circuit 23. The voltage supply circuit 26 controls the voltage level of the intermediate signal (VSS M) and thus controls drain-source voltages (Vds) of transistors of the first and second circuits 20 and 23 having their source nodes coupled to the intermediate signal (VSS M). As a result, degradation of the transistors due to hot carrier injection may be reduced without including an additional transistor for each of the first circuit 20 and the second circuit 23, which avoids the need to use area for additional transistors.

The first circuit, the second circuit, and the voltage supply circuit shown in FIG. 2 are merely an example of circuits that may be used. In other embodiments, different circuits may be used. For example, the transistors 21, 24 and 27 are p-channel transistors and the transistors 22, 25 and 28 are n-channel transistors in FIG. 2. However, some other channel type of transistors may be used alternatively and/or additionally to the p-channel transistors and the n-channel transistors in FIG. 2.

Figure 3:
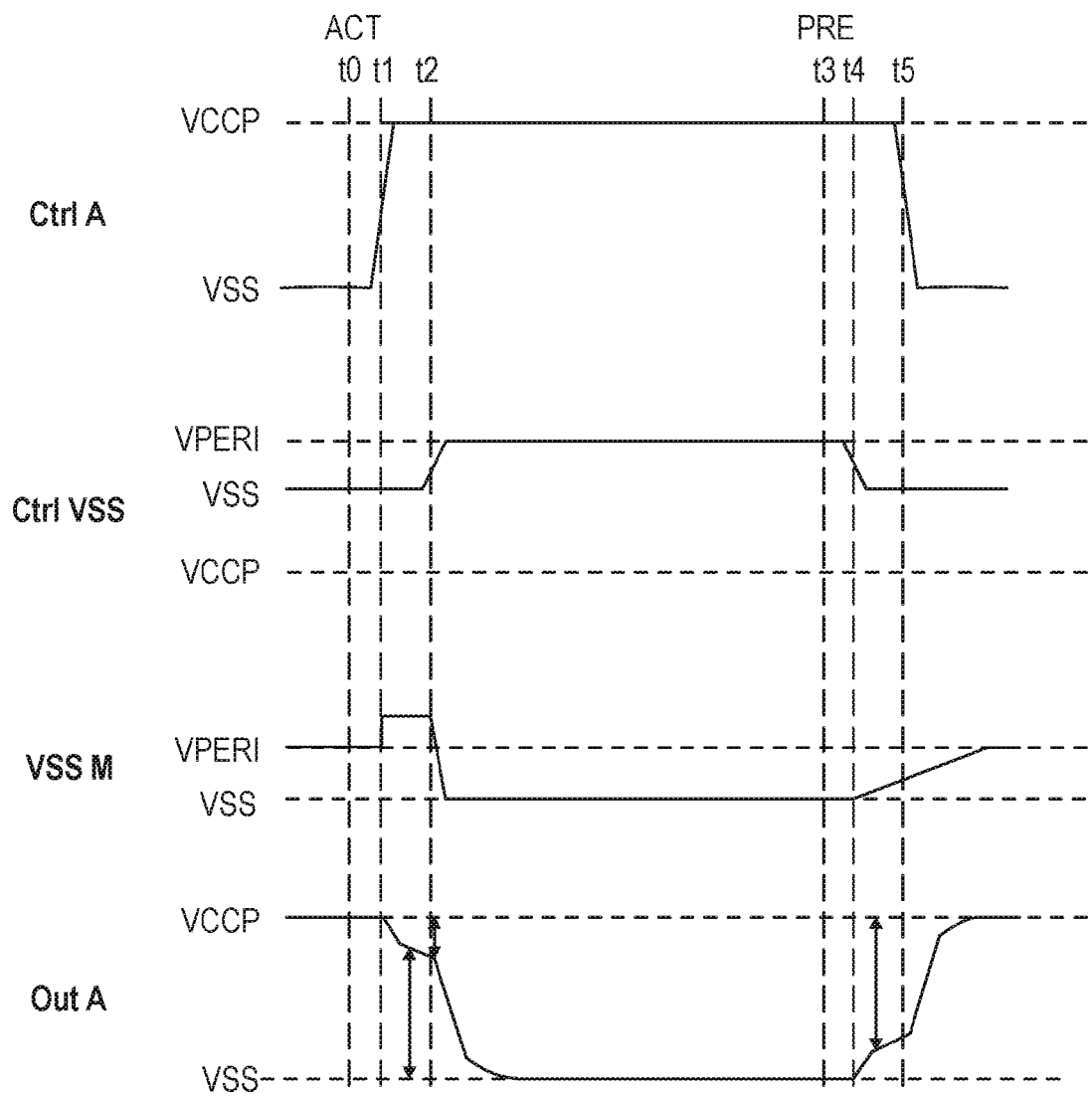
FIG. 3 is a timing diagram of various signals of the apparatus of FIG. 2, in accordance with an embodiment of the present disclosure.

FIG. 3 is a timing diagram of various signals of the apparatus of FIG. 2, in accordance with an embodiment of the present disclosure. For example, a first command for selecting a bank and row address is provided at a time t0. In some embodiments, the first command is an ACT command, as shown in FIG. 3. The VSS control signal (Ctrl VSS) is initially set to a first logic level (e.g., logic low) at the time t0. The VSS control signal (Ctrl VSS) at the first logic level activates the transistor 27 and deactivates the transistor 28. As a result, the intermediate signal (VSS M) is set to a voltage level of VPERI at the time t0. The first control signal (Ctrl A) is also initially set to the first logic level at a time t0. The first control signal (Ctrl A) at the first logic level activates the transistor 21 and deactivates the transistor 22, and as a result the first output signal (Out A) is set to a voltage level of VCCP at the time t0. Thus, Vds of the transistor 22 is set to "VCCP-VPERI" at the time t0.

As for the first circuit 20, the first control signal (Ctrl A) is set to a second logic level (e.g., logic high) around a time t1, responsive to the first command at the time t0. For example, the second logic level of the first control signal (Ctrl A) may be VCCP. Responsive to a change of the first control signal (Ctrl A) to the second logic level, the transistor 21 is deactivated and the transistor 22 is activated. Due to the activation of the transistor 22, the intermediate signal (VSS M) is set to a voltage level higher than the voltage level of VPERI (e.g., assuming VCCP=3 volts and VPERI=1 volt, the voltage is approximately 1.5 V, or "VPERI+α") at the time t1. The Vds of the transistor 22 at the time t1 becomes "VCCP-(VPERI+α)" that is "(VCCP-VPERI)-α". The activation of the transistor 22 also causes the voltage level of the first output signal (Out A) to start decreasing at the time t1.

As for the voltage supply circuit 26, the Vds of the transistor 28 at the time t1 becomes a difference between the voltage level of the intermediate signal (VSS M) and the voltage level VSS of the ground terminal 206. Because the voltage level of VSS M is a difference between the voltage level of the first control signal (Ctrl A) which is VCCP and a threshold voltage Vt of the transistor 22 (Vt(Tr2)), the Vds of the transistor 28 may be calculated as "(VCCP-Vt(Tr2))-VSS". In some embodiments, the transistor 22 may have a threshold voltage Vt approximately 0.75 volts. The VSS control signal (Ctrl VSS) is set to the second logic level (e.g., logic high) around a time t2, responsive to the first command at the time t0. For example, a voltage level of the second logic level of the VSS control signal (Ctrl VSS) may be VPERI. Responsive to a change of the VSS control signal (Ctrl VSS) to the second logic level, the transistor 27 is deactivated and the transistor 28 is activated. Due to the activation of the transistor 28, the intermediate signal (VSS M) is set to a voltage level of VSS around the time t2.

The voltage level of the first output signal (Out A) in the first circuit 20 is about "VCCP-Vt(Tr2)" by the time t2, the Vds of the transistor 22 at the time t2 becomes "(VCCP-Vt(Tr2))-VSS" that is lower than "VCCP-VSS". Thus, the Vds of the transistor 22 and the Vds of the transistor 28 can be lower than a voltage of "VCCP-VSS", and the hot carrier injection may be prevented. After the time t2, the voltage level of the intermediate signal (VSS M) and the voltage level of the first output signal (Out A) decrease to the voltage level of VSS.

Thus, the first output signal (Out A) falls in two stages. From the time t1 to the time t2, the transistor 22 is activated. The Vds of the transistor 22 from the time t1 to the time t2 is "VCCP-VPERI" that is lower than "VCCP-VSS". In addition, the transistor 28 is activated after the time t2. The Vds of the transistor 28 after the time t2 is "VCCP-Vt-VSS", that is lower than "VCCP-VSS".

In another example, a second command for deactivating the activated bank and row address is provided at a time t3. In some embodiments, the second command is a PRE command. The VSS control signal (Ctrl VSS) is at the second logic level (e.g., logic high) at the time t3. The VSS control signal (Ctrl VSS) at the second logic level has been deactivating the transistor 27 and activating the transistor 28. As a result, the intermediate signal (VSS M) has been set to a voltage level of VSS at the time t3. The first control signal (Ctrl A) is at the second logic level at a time t3. The first control signal (Ctrl A) at the second logic level has been deactivating the transistor 21 and activating the transistor 22. As a result, the first output signal (Out A) has been also set to a voltage level of VSS at the time t3.

As for the voltage supply circuit 26, the VSS control signal (Ctrl VSS) is set to the first logic level (e.g., logic low) around a time t4, responsive to the second command at the time t3. Responsive to a change of the VSS control signal (Ctrl VSS) to the first logic level, the transistor 27 is activated and the transistor 22 is deactivated. Due to the activation of the transistor 27, the intermediate signal (VSS M) starts increasing to the voltage level of VPERI at the time t4. This causes the first output signal (Out A) to increase to a voltage level slightly higher than the voltage level of VSS around the time t4, because of the increased level of the intermediate signal (VSS M) and the transistor 22 being active while the first control signal (Ctrl A) is at the second logic level. The Vds of the transistor 22 is less than "VCCP–VSS" at the time t4.

As for the first circuit 20, the first control signal(Ctrl A) is set to the first logic level (e.g., logic low) around a time t5, responsive to the second command at the time t3. Responsive to a change of the first control signal (Ctrl A) to the first logic level, the transistor 22 is deactivated and the transistor 21 is activated. Due to the activation of the transistor 21, the first output signal (Out A) is set to the voltage level of VCCP after the time t5. Here, the Vds of the transistor 22 after the time t4 increases to "VCCP–VPERI", which is the same Vds at time t0 and is still acceptable with respect to the hot carrier injection. Thus, the Vds of the transistor 22 and the Vds of the transistor 28 can be reduced below a voltage such as "VCCP–VSS", and hot carrier injection can be prevented.

Figure 4A:
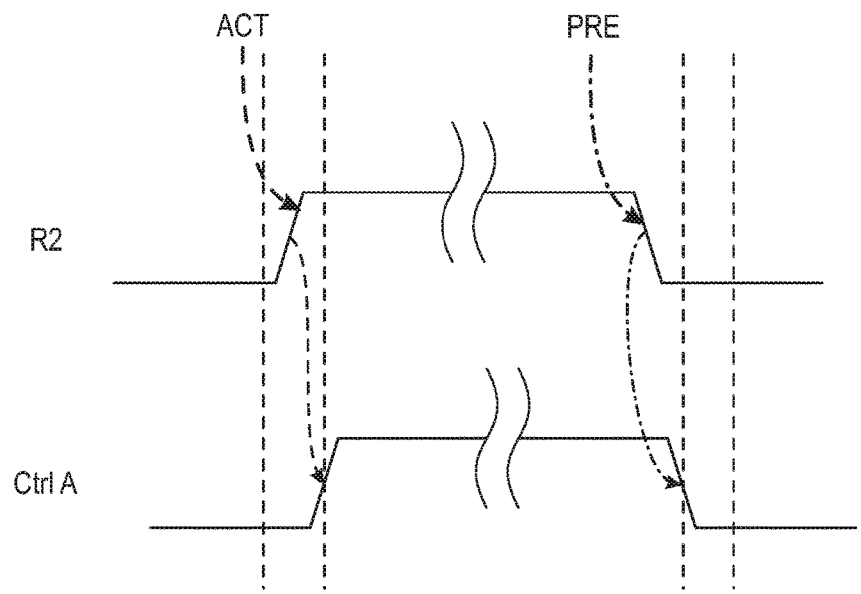
FIG. 4A is a timing diagram of a relationship between various signals of the inverter circuits of FIG. 1A.

Control signals, including a first control signal (Ctrl A), may be generated based on at least one control signal provided to the inverter circuit 10 of FIG. 1A. FIG. 4A is a timing diagram of a relationship between various signals of the inverter circuits of FIG. 1A. A second external control signal R2 is a signal provided to the inverter circuit 10. For example, a logic level of the second external control signal R2 is set to a second logic level (e.g., logic high) based on a timing of a first command. In some embodiments, the first command is an ACT command. Consequently, the logic level of the first control signal (Ctrl A) is set to the second logic level (e.g., logic high), responsive to the second external control signal R2 being set to the second logic level. The logic level of the second external control signal R2 is set to a first logic level (e.g., logic low) based on a timing of a second command. In some embodiments, the second command is a PRE command. Consequently, the logic level of the first control signal (Ctrl A) is set to the first logic level (e.g., logic low), responsive to the second external control signal R2 being set to the first logic level.

Figure 4B:
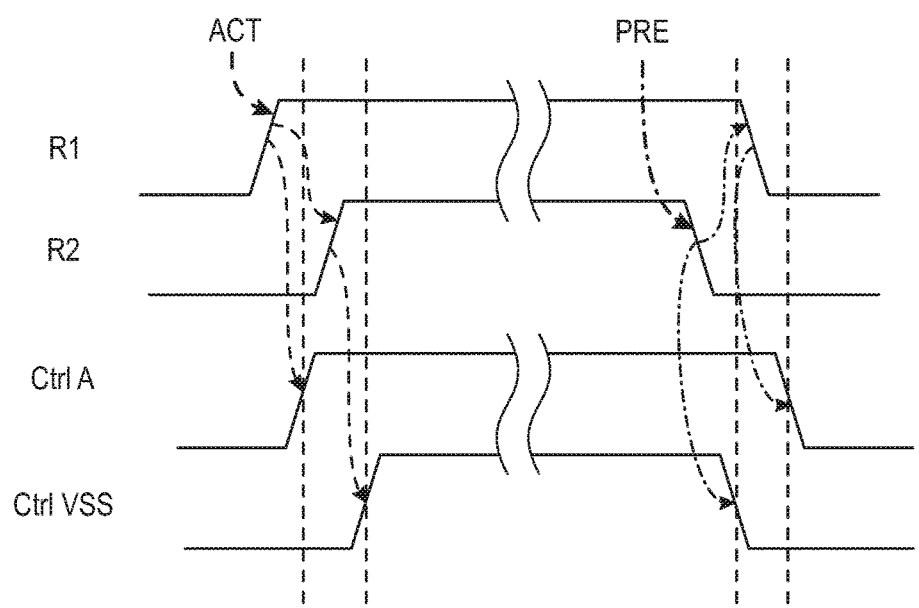
FIG. 4B is a timing diagram of a relationship between various signals of the apparatus of FIG. 2.

In order to provide a VSS control signal (Ctrl VSS) in addition to the first control signal (Ctrl A) to provide timings described the above referring to FIG. 3, another control signal may be used. FIG. 4B is a timing diagram of a relationship between various signals of the apparatus 2 of FIG. 2. External control signals R1 and R2 are provided to the apparatus 2. For example, a logic level of the first external control signal R1 is set to a second logic level (e.g., logic high) based on a timing of a first command. The first command in some embodiments may be an ACT command. The logic level of the first control signal (Ctrl A) is set to the second logic level, responsive to the first external control signal R1 being set to the second logic level, followed by the logic level of the second external control signal R2 being set to the second logic level, also responsive to the first external control signal R1 being set to the second logic level. The logic level of the VSS control signal (Ctrl VSS) is set to the second logic level, responsive to the second external control signal R2 being set to the second logic level. On the other hand, the logic level of the second external control signal R2 is set to a first logic level (e.g., logic low) based on a timing of a second command. The second command in some embodiments may be a PRE command. The logic level of the VSS control signal (Ctrl VSS) is set to the first logic level, responsive to the second external control signal R2 being set to the first logic level, followed by the logic level of the first external control signal R1 being set to the first logic level, also responsive to the second external control signal R2 being set to the first logic level. The logic level of the first control signal (Ctrl A) is set to the first logic level, responsive to the first external control signal R1 being set to the first logic level.

Figure 5:
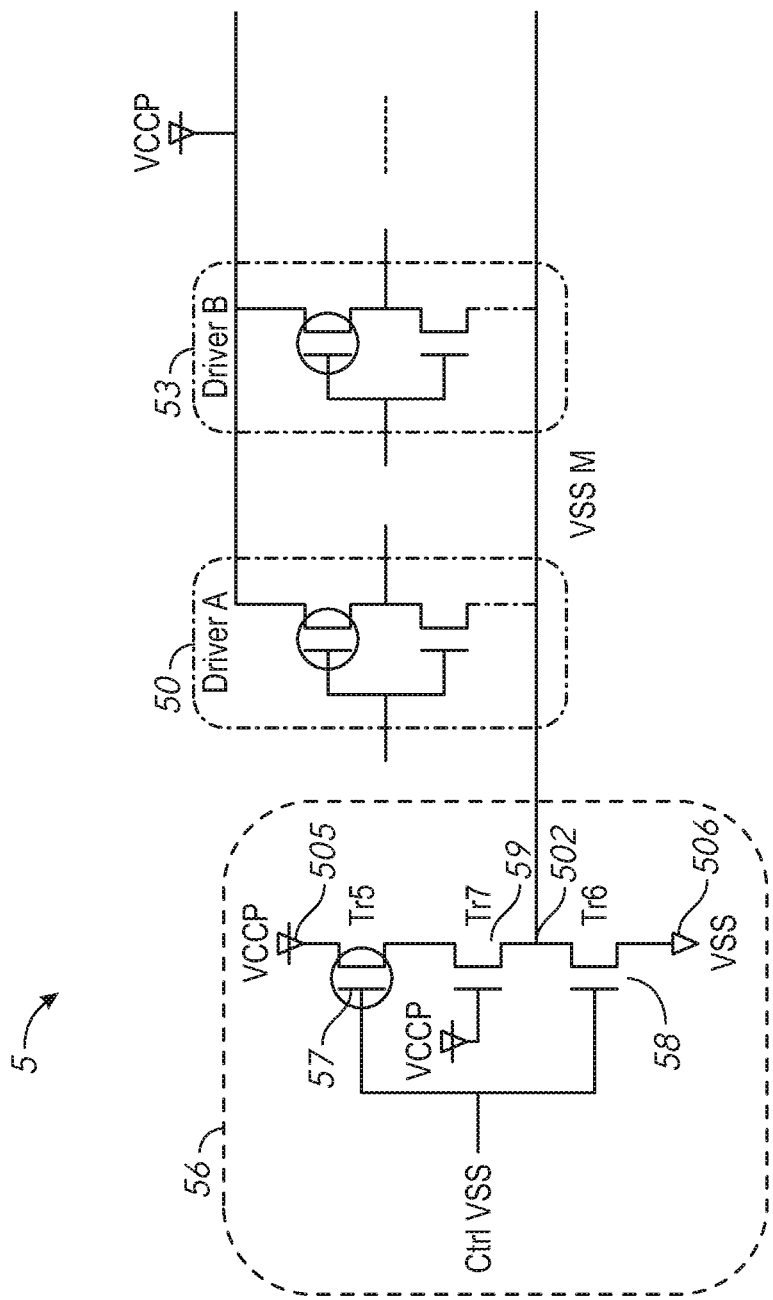
FIG. 5 is a circuit diagram of an apparatus in a semiconductor device, in accordance with an embodiment of the present disclosure.

FIG. 5 is a circuit diagram of an example of an apparatus 5 in a semiconductor device, in accordance with an embodiment of the present disclosure. The apparatus 5 may include a plurality of main word line drivers, such as a first driver 50, which may be equivalent to the first circuit 20 of FIG. 2, and a second driver 53, which may be equivalent to the second circuit 23 of FIG. 2. Description of components corresponding to components included in FIG. 2 will not be repeated. The apparatus 5 may further include a voltage supply circuit 56. The voltage supply circuit 56 includes a pair of transistors, a transistor 57 having a source node coupled to a second power terminal 505 being supplied with the first voltage (VCCP), and a transistor 58 having a source node coupled to a ground terminal 506, being supplied with a third voltage (VSS). A gate of the transistor 57 and a gate of the transistor 58 are coupled to each other and receive a VSS control signal (Ctrl VSS). Additionally, the voltage supply circuit 56 may also include a transistor 59 between a drain node of the transistor 57 and a drain node of the transistor 58. An intermediate signal (VSS M) is provided to the first and second drivers 50 and 53 from a node 502 coupled to the drain node of the transistor 58 and a source node of the transistor 59. The first voltage (VCCP) is provided to a source node 505 of the transistor 57 and a gate of the transistor 59.

The transistor 57 is activated and a voltage level at a drain node of the transistor 57 becomes VCCP, when the VSS control signal (Ctrl VSS) is at a first logic level (e.g., logic low). Because the voltage supply circuit 56 includes the transistor 59, the voltage level of the node 502 becomes a second voltage, which is a difference between the voltage level of the drain node of the transistor 57 (=VCCP) and a threshold voltage Vt of the transistor 59 (Vt(Tr7)), namely "VCCP–Vt(Tr7)". On the other hand, the transistor 58 is activated and a voltage level of the node 502 becomes a third voltage (VSS), when the VSS control signal (Ctrl VSS) is at a second logic level (e.g., logic high). Responsive to the VSS control signal (Ctrl VSS), the voltage supply circuit 56 selects one of the second voltage "VCCP–Vt(Tr7)" and the third voltage (VSS), and provides the selected voltage to the node 502 as the intermediate signal (VSS M). Thus, the voltage supply circuit 56 may control a voltage level of intermediate signal (VSS M) on the node 502 to reduce drain-source voltage levels of the transistors in the first driver 50 and the second driver 53, which may prevent degradation of the transistors due to hot carrier injection.

The first circuit, the second circuit, and the voltage supply circuit shown in FIG. 5 are merely an example of circuits that may be used. In other embodiments, different circuits may be used. For example, the transistor 57 may be a p-channel transistor and the transistor 58 may be an n-channel transistor in FIG. 5. However, some other channel type of transistors may be used alternatively and/or additionally to the p-channel transistors and the n-channel transistors in FIG. 5.

Figure 6:
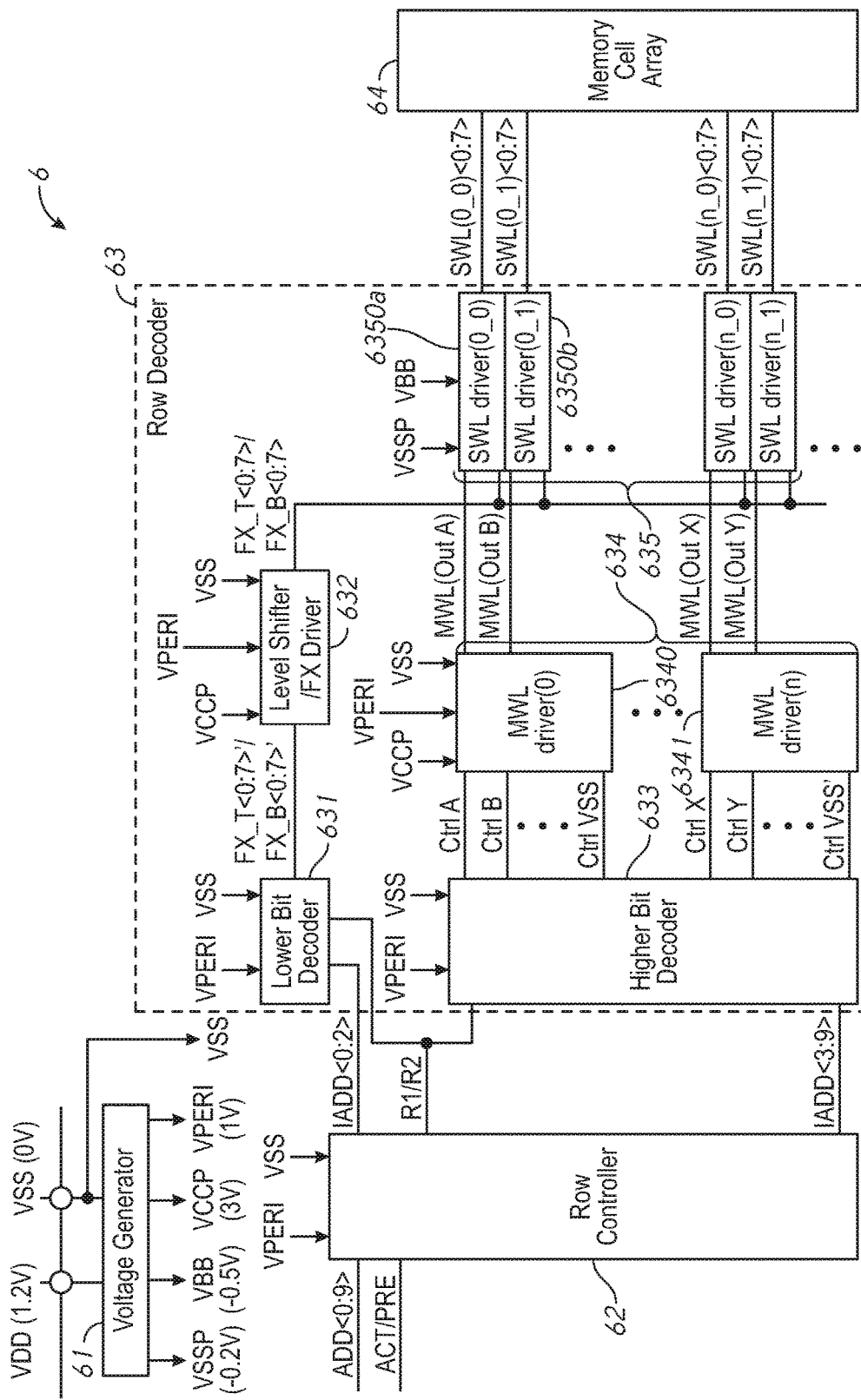
FIG. 6 is a block diagram of peripheral circuit blocks including an apparatus in a semiconductor device, in accordance with an embodiment of the present disclosure.

FIG. 6 is a block diagram of peripheral circuit blocks including an apparatus in a semiconductor device, in accordance with an embodiment of the present disclosure. The apparatuses provided in FIGS. 2 and 5 may be used as main word line (MWL) drivers of the semiconductor device. For example, the semiconductor device may be a semiconductor memory device, such as dynamic random access memory (DRAM) 6. The DRAM 6 may include a voltage generator 61. The voltage generator 61 receives a first power supply potential (VDI)) and a second power supply potential (VSS). In the example of FIG. 6, the first power supply potential (VDD) is 1.2V and the second power supply potential (VSS) is 0V. The voltage generator 61 generates various types of internal potentials VCCP, VPERI, VBB, VSSP, and the like based on the first and second power supply potentials VDD, VSS. For example, the internal potential VPERI is a potential used in a row controller 62 and a row decoder 63. The internal potentials VSSP, VBB are potentials mainly used in the row decoder 63, particularly by sub word line drivers 635. The internal potential VPERI is a potential used in many other circuit blocks. The row control circuit 62 receives address signals ADD<0:9>, a first command and a second command (e.g., an ACT command and a PRE command), as well as the internal potential VPERI and the second power supply potential VSS. The address signals ADD<0:9> may be bits<0:9> of a row address. Responsive to the received address signals and the first/second commands, the row controller 62 generates row control signals R1 and R2 which can be used as external control signals R1 and R2 in FIG. 4B. The row controller 62 controls the row decoder 63 by providing the row control signals R1 and R2 and internal address signals IADD<0:2> and IADD<3:9> based on the address signals ADD<0:9>. In the row decoder 63, a lower bit decoder 631 receives the internal address signals IADD<0:2> and the row control signals R1 and R2 as well as the internal potential VPERI and the second power supply potential VSS. The lower bit decoder 631 decodes the internal address signals IADD<0:2> and provides selection signals FX_T<0:7>' and FX_B<0:7>'. A level shifter/FX driver 632 receives the selection signals FX_T<0:7>' and FX_B<0:7>' as well as the internal potentials VCCP and VPERI and the second power supply potential VSS and generates word driver selection signals FX_T<0:7> and FX_B<0:7>. A higher bit decoder 633 receives the internal address signals IADD<3:9> and the row control signals R1 and R2 as well as the internal potential VPERI and the second power supply potential VSS. The higher bit decoder 633 decodes the internal address signals IADD<3:9> and provides 128 control signals to main word line (MWL) drivers 634 responsive to the row control signals R1 and R2. For example, the higher bit decoder 633 provides the control signals Ctrl A, Ctrl B, . . . and Ctrl VSS to a first main word line driver 6340 "MWL driver(0)" of the main word line drivers 634. The first main word line driver 6340 provides output signals Out A and Out B, which are selection signals of a main word line. Similarly, the higher hit decoder 633 provides the control signals Ctrl X, Ctrl Y, . . . and Ctrl VSS' to a second main word line driver 6341 "MWL driver(n)" of the main word line drivers 634, where n is a predetermined natural number. The second main word line driver 6341 provides output signals Out X and Out Y which are also selection signals of the main word line. Thus, the main word drivers 634 are provided to drive the main word line. Sub word line (SWL) drivers 635 receive the word driver selection signals FX_T<0:7> and FX_B<0:7> and the selection signals of the word lines Out A, Out B, . . . Out X and Out Y, as well as the internal potentials VSSP and VBB. For example, a first SWL driver (0_0) 6350a receives a selection signal of the word line Out A and the word driver selection signals and provides selection signal of the sub word line SWL(0_0)<0:7>. Similarly, the second SWL driver (0_1) 6350a receives a selection signal of the word line Out B and the word driver selection signals and provides selection signal of the sub word line SWL(0_1)<0:7>. Thus, by decoding the selection signals of the word lines based on the word driver selection signals, the sub word line drivers 635 provide selection signals of the sub word line to a memory cell array 64 in order to select one of sub word lines when the corresponding one of the main word lines is also selected.

Figure 7:
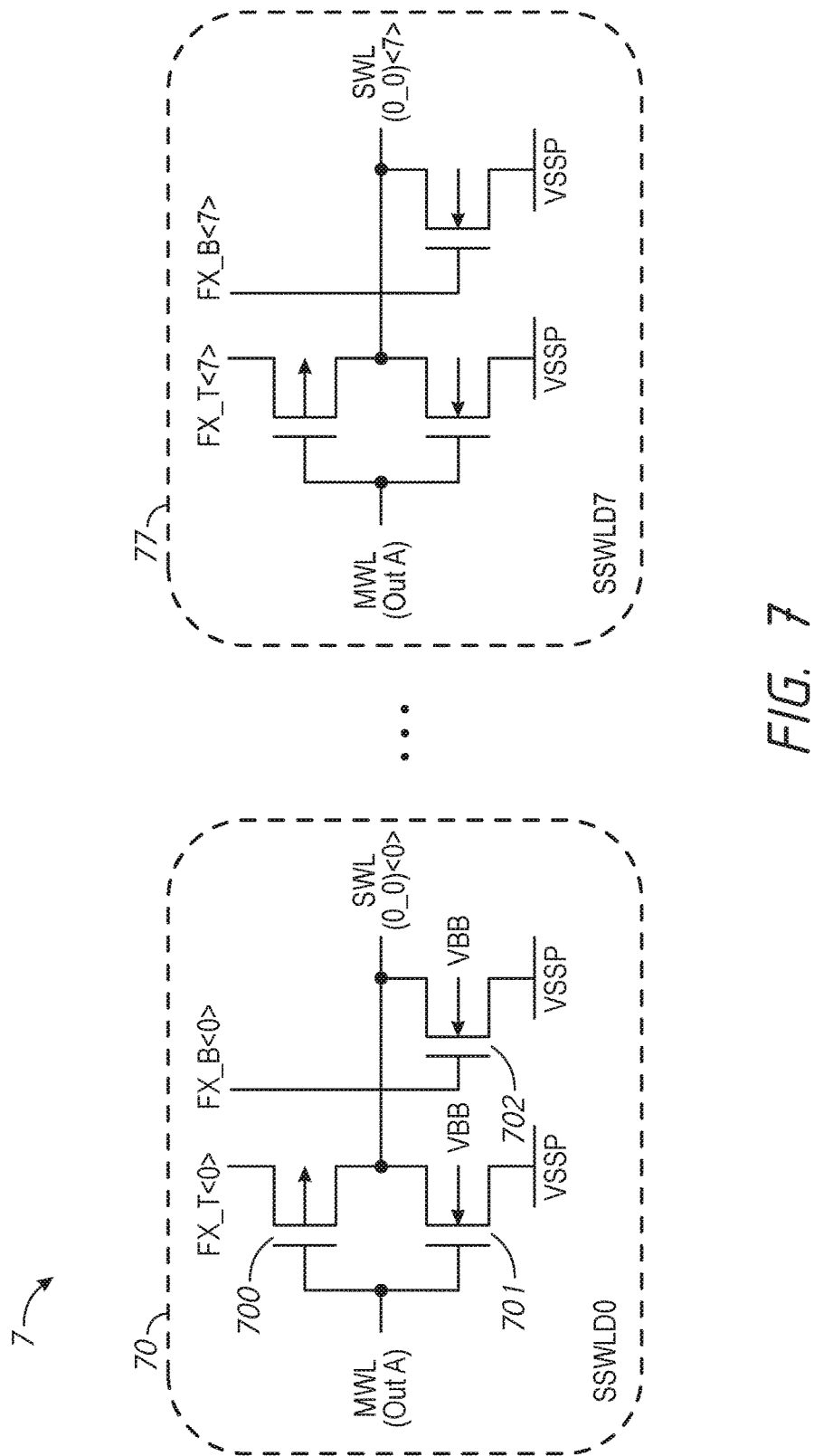
FIG. 7 is a circuit diagram of a sub word line driver in a semiconductor device, in accordance with an embodiment of the present disclosure.

FIG. 7 is a circuit diagram of a first SWL driver (0_0) 7 in a semiconductor device, in accordance with an embodiment of the present disclosure. For example, the first SWL driver (0_0) 7 may be used as the first SWL driver (0_0) 6350a in FIG. 6. The first SWL driver (0_0) 7 includes a plurality of sub SWL drivers SSWLD0 70, . . . and SSWLD7 77 for driving the sub-word lines SWL(0_0)<0>, . . . SWL(0_0)<7>, respectively. Each sub SWL driver includes one first type transistor and two second type transistors. For example, the SSWLD0 70 may include transistors 700, 701 and 702, Here, VSSP is one of the internal potentials indicative of an inactive level of the sub-word lines, and is a negative potential less than the ground potential VSS. The drains of the transistors 700, 701, 702 are all coupled to the sub-word line SWL(0_0)<0>. A corresponding word driver selection signal FX_T<0> is provided to a source node of the first transistor 700. A corresponding main word line (Out A) is coupled to gates of the first and second transistors 700 and 701. A corresponding complementary word driver selection signal FX_B<0> is provided to a gate of the transistor 702. The negative potential VSSP that is less than VSS is supplied to source nodes of the transistors 701 and 702. When the main word line Out A and the complementary word driver selection signal FX_B<0> are set to a first logic level (e.g., logic low represented by a potential of VSS), and the word driver selection signal FX_T<0> is set to a second logic level (e.g., logic high represented by a potential of VCCP), the transistor 700 is turned on and the transistors 701 and 702 are turned off. Consequently, a voltage level of the sub-word line SWL(0_0)<0> becomes VCCP. Thus, a cell transistor on a memory cell array coupled to the sub-word line SWL(0_0)<0> is turned on. When the main word line MWL(0_0)<0> is set to the second logic level (e.g., logic high represented by the potential of VCCP) or when the word driver selection signal FX_T<0> is set to the first logic level (e.g., logic low) and the complementary word driver selection signal FN_B<0> is set to the second logic level (e.g. logic high represented by the potential of VCCP), the voltage level of the sub-word line SWL(0_0)<0> becomes VSSP. Thus, the cell transistor coupled to the sub-word line SWL(0_0)<0> remains in an off state.

Figure 8:
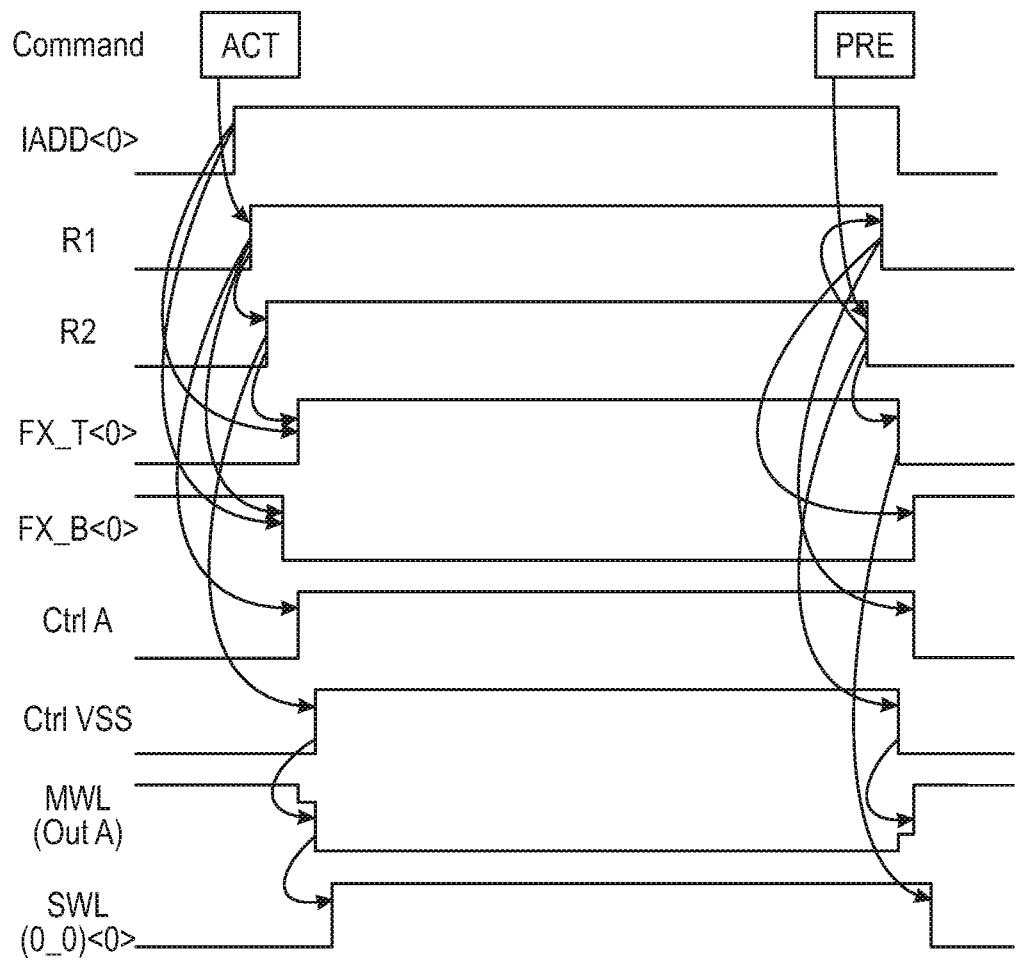
FIG. 8 is a timing diagram of various signals in the peripheral circuit blocks of FIG. 6, in accordance with an embodiment of the present disclosure.

FIG. 8 is a timing diagram of various signals in the peripheral circuit blocks of FIG. 6, in accordance with an embodiment of the present disclosure. As described with reference to FIG. 6, a row controller 62 generates row control signals R1 and R2. For example, the row controller 62 changes a level of a first row control signal R1 from a first logic level to a second logic level responsive to a first command. The row controller 62 also changes a level of a second row control signal R2 from the first logic level to the second logic level responsive to the first row control signal R1. A lower bit decoder 631 changes a level of a complementary word driver selection signal FX_B<0> from the second logic level to the first logic level responsive to an internal address signal IADD<0> and the first row control signal R1. The lower bit decoder 631 also changes a level of a word driver selection signal FX_T<0> from the first logic level to the second logic level responsive to an internal address signal IADD<0> and the second row control signal R2. A higher bit decoder 633 changes a level of one of control signals for selecting a main word line from the first logic level to the second logic level responsive to the first row control signal R1 and a combination of internal address signals IADD<3:9>. The higher bit decoder 633 further changes a level of a VSS control signal (Ctrl VSS) from the first logic level to the second logic level, responsive to the second row control signal R2 and the combination of international address signals IADD<3:9>. By this level change of the VSS control signal (Ctrl VSS), an appropriate VSS control signal corresponding to one of control signals and a destination MWL driver can be activated. For example, with reference to FIG. 6, a first VSS control signal (Ctrl VSS) and one of Ctrl A, Ctrl B . . . can be activated for a MWL driver(0). Alternatively, a second VSS control signal (Ctrl VSS') and one of Ctrl X, Ctrl Y, for a MWL driver(n) can be activated. In FIG. 8, a level of the corresponding main word line that is an output signal (Out A) decreases for a small amount responsive to the activation of the first control signal (Ctrl A), and further decreases to the VSS level responsive to the VSS control signal (Ctrl VSS). A voltage level of a sub word line SWL(0_0)<0> changes from the first logic level to the second logic level, responsive to the first output signal (Out A) being set to the VSS level.

Similarly, the row controller 62 changes the level of the second row control signal R2 from the second logic level to the first logic level responsive to a second command. The row controller 62 also changes the level of the first row control signal R1 from the second logic level to the first logic level responsive to the second row control signal R2. The lower bit decoder 631 also changes the level of the word driver selection signal FX_T<0> from the second logic level to the first logic level responsive to the second row control signal R2. The lower bit decoder 631 also changes the level of the complementary word driver selection signal FX_B<0> from the first logic level to the second logic level responsive to the first row control signal R1. The higher bit decoder 633 changes the level of the activated VSS control signal (Ctrl VSS) from the second logic level to the first logic level responsive to the second row control signal R2 and possibly the combination of international address signals IADD<3:9> so that the appropriate destination MWL driver can be deactivated. The higher bit decoder 633 also changes the level of the selected one of control signals for deselecting a main word line from the second logic level to the first logic level responsive to the first row control signal R1 and possibly the combination of internal address signals IADD<3:9>. In FIG. 8, the level of the corresponding main word line (Out A) increases for a small amount responsive to the deactivation of the VSS control signal (Ctrl VSS), and further increases to the VCCP level responsive to deactivation of the first control signal (Ctrl A). The voltage level of the sub word line SWL(0_0)<0> changes from the second logic level to the first logic level, responsive to the word driver selection signal FX_T<0> being set to the first logic level.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
   a first circuit comprising a first output node and coupled between first and second nodes, the first node being supplied with a first voltage; and
   a voltage supply circuit comprising a second output node coupled to the second node and coupled between third and fourth nodes, the third node being supplied with a second voltage, and the fourth node being supplied with a third voltage,
   a decoder circuit configured to provide a first control signal having a first value to cause the first circuit to couple the first output node to the first node and a second control signal having a first value to cause the voltage supply circuit to couple the second output node to the third node at a first time,
   wherein the decoder circuit further configured to provide the first control signal having a second value to cause the first circuit to couple the first output node to the second node at a second time after the first time while the voltage supply circuit maintains coupling the second output node to the third node, and
   wherein the decoder circuit further configured to provide the second control signal having a second value to cause the voltage supply circuit to couple the second output node to the fourth node at a third time while the first circuit maintains coupling the first output node to the second node.

2. The apparatus of claim 1, wherein the first voltage is greater h the second voltage and the second voltage is greater than the third voltage.

3. The apparatus of claim 2, wherein the first circuit comprises first and second transistors coupled in series between the first and second nodes, the voltage supply circuit comprising third and fourth transistor coupled in series between the third and fourth nodes, each of the first and third transistors being of a first conductivity type and each of the second and fourth transistors being of a second conductivity type.

4. The apparatus of claim 2, wherein a first voltage difference between the first voltage and the second voltage is greater than a second voltage difference between the second voltage and the third voltage.

5. The apparatus of claim 1, wherein the first voltage is equal to the second voltage and each of the first and second voltages is greater than the third voltage.

6. The apparatus of claim 5, wherein the first circuit comprises first and second transistors coupled in series between the first and second nodes, the voltage supply circuit comprising third and fourth transistor coupled in series between the third and fourth nodes, the first transistor being of a first conductivity type and each of the second, third and fourth transistors being of a second conductivity type.

7. The apparatus of claim 1, wherein the voltage supply circuit is further configured to couple the second output node to the third node at a fourth time after the third time while the first circuit maintains coupling the first output node and the second node.

8. The apparatus of claim 7, wherein the first circuit is further configured to couple the first output node to the first node at a fifth time after the fourth time while the voltage supply circuit maintains coupling the second output node to the third node.

9. A method comprising:
charging a first output node with a first voltage responsive to an inactivation of a first control signal received at a driver circuit of a semiconductor device from a decoder circuit of the semiconductor device at a first time, wherein the inactivation of the first control signal is caused by a PRE command;
charging a first node with a second voltage lower than the first voltage responsive to an inactivation of a second control signal received at the driver circuit from the decoder circuit at the first time;
discharging the first output node toward the second voltage by coupling the first output node to the first node responsive to an activation of the first control signal received at the driver circuit from the decoder circuit at a second time after the first time; and
discharging the first output node toward a third voltage lower than the second voltage responsive to an activation of the second control signal received at the driver circuit from the decoder circuit at a third time after the second time in response to the second control signal having a second value.

10. The method of claim 9, wherein a first voltage difference between the first voltage and the second voltage is greater than a second voltage difference between the second voltage and the third voltage.

11. The method of claim 9, further comprising:
charging the first output node toward the second voltage responsive to the inactivation of the second control signal at a fourth time after the third time; and
charging the first output node toward the first voltage responsive to the inactivation of the first control signal at a fifth time after the fourth time.

12. The method of claim 11, wherein the activation of the first control signal is caused by an ACT command.

13. The method of claim 12, wherein the activation of the second control signal is caused by the ACT command and the inactivation of the second control signal is caused by the PRE command.

14. The method of claim 13, wherein each of the activation of the first and second control signals is defined as a first signal transition from a low logic level to a high logic level and each of the inactivation of the first and second controls signals is defined as a second signal transition from the high logic level to the low logic level.

* * * * *